Jan. 16, 1968 G. K. ZIN 3,364,388

LIGHT EMITTER CONTROLLED BY BI-STABLE SEMICONDUCTOR SWITCH

Filed July 16, 1965 2 Sheets-Sheet 1

INVENTOR.
GARY K. ZIN
BY Glenn H. Bruestle
Attorney

LIGHT EMITTER CONTROLLED BY BI-STABLE SEMICONDUCTOR SWITCH

Filed July 16, 1965

2 Sheets-Sheet 2

INVENTOR.
GARY K. ZIN
BY
Glenn H. Bennettle

United States Patent Office 3,364,388

Patented Jan. 16, 1968

3,364,388
LIGHT EMITTER CONTROLLED BY BI-STABLE SEMICONDUCTOR SWITCH

Gary K. Zin, Philadelphia, Pa., assignor to Radio Corporation of America, a corporation of Delaware Filed July 16, 1965, Ser. No. 472,501
14 Claims. (Cl. 315—166)

ABSTRACT OF THE DISCLOSURE

A display device comprises an elemental light-emitting area, such as an electroluminescent cell, and a control element in series therewith. The control element, which may be cadmium selenide, has a hysteretic electrical conductivity characteristic and exhibits two conductivity states. In order to switch the control element from a high conductivity state to a low conductivity state the voltage applied across the element must be reduced below a cut-off voltage for a time longer than the relaxation of the element. An A.C. bias voltage maintains the control element in either of the two states while a switching voltage causes the element to switch from one state to the other. When in its high conductivity state, a voltage applied across the light-emitter and the control element causes the light-emitter to give off light. When in its low conductivity state, the voltage drop occurs essentially across the control element and the light-emitter remains dark.

This invention relates to electrical display devices and particularly to an integrated solid-state display device for displaying luminous or visible patterns in accordance with modulated electrical signals.

Certain known solid-state display devices comprise a matrix or array of elemental light emitting areas including a control means at each elemental light emitting area for selecting image or pattern information relating to that elemental area, storing that information, and controlling the light output of the corresponding light emitting area in acccordance with that information.

One problem in the past has been the difficulty of physically combining, or integrating, available solid-state control means with the light emitting areas of the display devices, usually comprising electroluminescent (EL) materials. EL materials have relatively high impedances and require relatively high alternating voltages for efficient operation. In the past, complex and expensive circuit arrangements have been required to provide electrical matching between the known control means and the EL light emitting areas.

An object of this invention is to provide an integrated solid-state display device.

A further object of this invention is to provide an improved solid-state display panel block or unit.

Another object of this invention is to provide a new control means which is readily integrable with light emitting devices such as electroluminescent cells.

A still further object is to provide solid-state display devices having "infinite" light contrast ratios with zero ambient light, and having tonal or grey scale capabilities.

For achieving these objects, a display panel block or unit is provided comprising a light emitting area, preferably an electroluminescent (EL) cell, in series with a control or switching element comprising a semi-conductor material having an electrical conductivity hysteretic effect. In one preferred embodiment the semi-conductor material is cadmium selenide. The unit is connected across a source of bias voltage. The portion of the bias voltage which appears across the EL cell, hence the luminous emittance of the EL cell, is dependent upon the relative impedances of the control element and the EL cell. The impedance of the control element is responsive, in a manner described hereinafter, to voltages applied across the control element. Triggering and erase voltages are applied to the control element for varying the impedance of the control element and thus controlling the luminous emittance of the EL cell. The hysteretic effect of the control element material is utilized, in a manner described hereinafter, to provide the unit with a built-in memory or storage capability. That is, once changed from one impedance to another impedance by the application of a triggering or erase voltage, the control element retains its new impedance after removal of the triggering or erase voltage.

For providing an electrical display device, a plurality of EL cell and control element units are arranged, for example, in an X–Y matrix allowing individual addressing of each matrix unit. Means are provided for biasing each unit. Triggering and erase voltages derived from a computer or the like are utilized for independently operating each unit.

Figure 1:
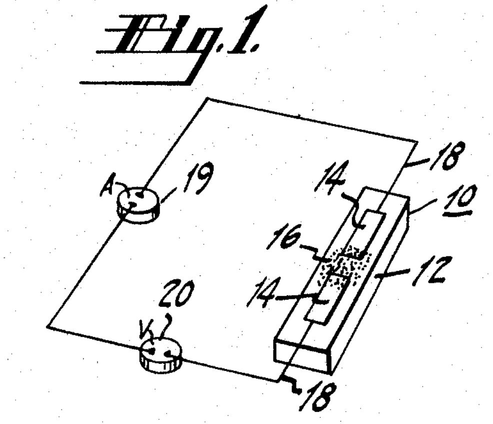
FIG. 1 is a view partially schematic and partially in perspective of an experimental cadmium selenide element connected in a circuit for determining the direct current electrical characteristics of the element.
Figure 3A:
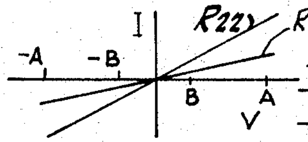
Figure 3B:
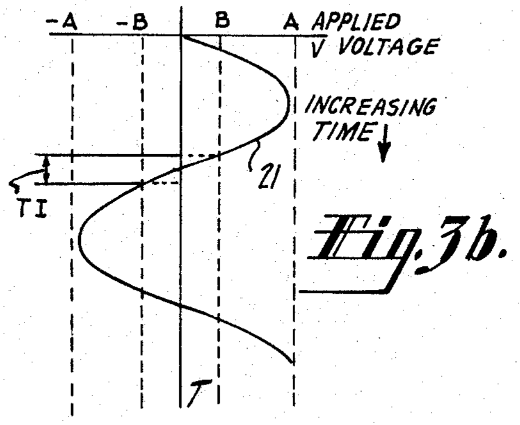
Figure 4:
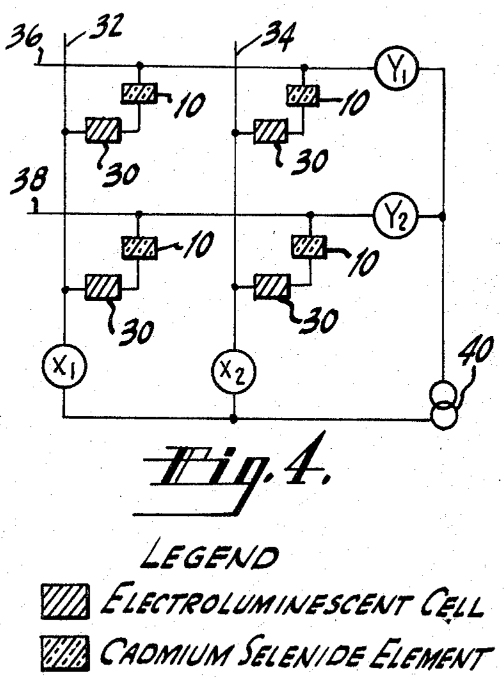
Figure 5:
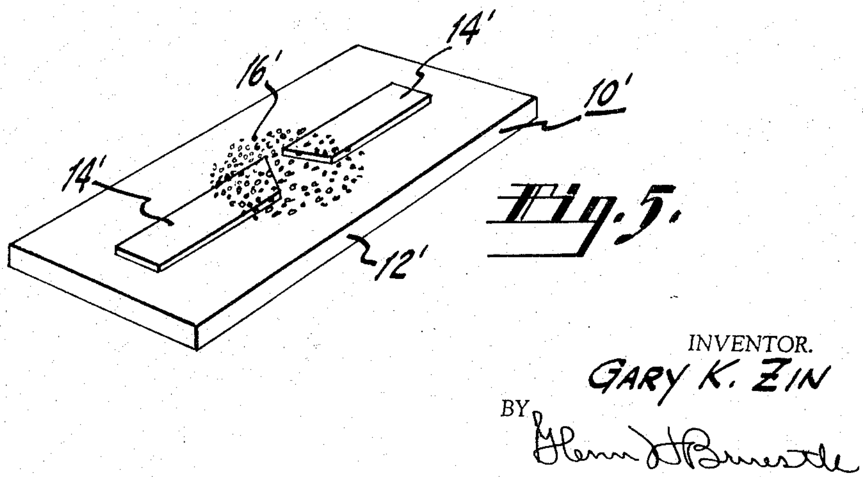
Figure 6:
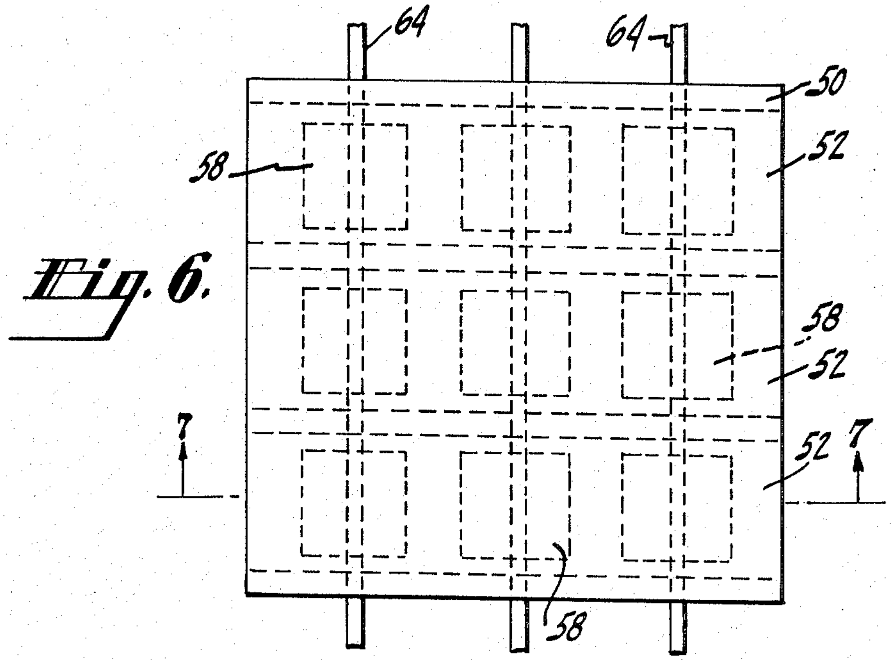
Figure 7:
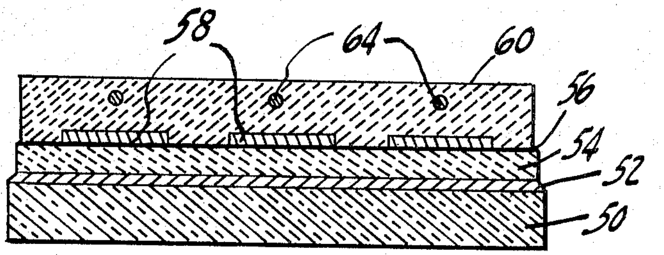

FIGS. 3*a* and 3*b* show the alternating current electrical characteristics of the cadmium selenide element shown in FIG. 1;

FIG. 4 is a block diagram of an electrically addressed matrix display device;

FIG. 5 shows a modification of the cadmium selenide element shown in FIG. 1;

FIG. 6 is a view of the back surface of a mosaic type electroluminescent display device;

FIG. 7 is a section along line 7—7 of FIG. 6; and

Figure 8:
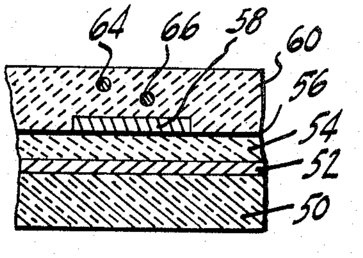

FIG. 8 is a fragmentary view similar to FIG. 7 and showing a modification of the display device.

The cadmium selenide control element 10 shown in FIG. 1 comprises a glass substrate 12 having a pair of spaced apart thin metal electrodes 14 thereon forming a gap. The ends of the electrodes 14 and the gap are covered by a layer of cadmium selenide material 16. The preparation of the cadmium selenide material is described in U.S. Patent 2,876,202 for Photoconducting Powders and Method of Preparation to Busanovich et al. The cadmium selenide is poly-crystalline, and the conductivity of each crystallite is dependent upon the electric field at each crystallite. The electrical characteristics of the mass of crystallites taken together is determined by applying a voltage across electrodes 14. By means of conductors 18, a source 20 of direct current voltage, an ammeter 19, and the cadmium selenide element 10 are all connected in series.

Figure 2:
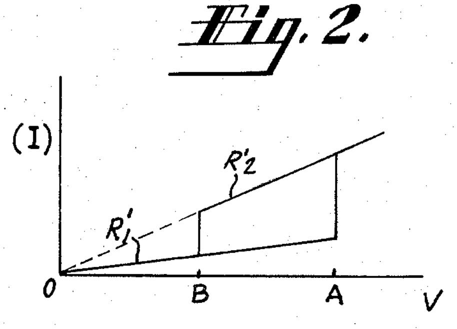
FIG. 2 shows the direct current electrical characteristics of the cadmium selenide element shown in FIG. 1.

In FIG. 2, the abscissa of the graph is direct current volts (V) applied across the cadmium selenide element 10, and the ordinate is direct current (I) through the element. The voltage-current characteristic lines shown are "idealized" lines. Actual characteristic lines appearing on an oscilloscope may be somewhat noisy and ragged. Also, the slopes of the lines are not shown to scale.

Starting with zero volts and with increasing voltage, the cadmium selenide element has a substantially constant resistivity R1, and its voltage-current characteristic is a substantially straight line R1′. When the voltage reaches a certain voltage A, termed the "threshold" voltage, the resistivity of the cadmium selenide element abruptly decreases about one to three orders of magnitude to a new resistivity R2. With further increasing voltage the resistivity of the element 10 remains substantially constant at its new resistivity, and the voltage-current characteristic is a substantially straight line R2'. With decreasing voltage, the cadmium selenide element 10 exhibits a conductivity hysteretic characteristic and retains the R2 value of resistivity until the applied voltage is decreased to a voltage B less than the threshold voltage A. The voltage B is termed the "cut-off" voltage. At this point, the resistivity of the cadmium selenide element returns to its original value R1. To again change the resistivity of the element 10 to the R2 value, the voltage across the cadmium selenide element is increased to the threshold voltage A.

While at the higher resistivity R1, the cadmium selenide element is referred to as being in its "quiescent" or "relaxed" state, and while at the lower resistivity R2, in its "excited" state. To return the cadmium selenide element from the excited stated to the quiescent state, the applied voltage is reduced to the cut-off or lower voltage for a time longer than a certain time known as the "relaxation" time of the cadmium selenide material. To trigger the cadmium selenide element to its excited state, the applied voltage is increased to exceed the threshold voltage for a time longer than a time known as the "excitation" time.

The electrical conductivity hysteretic characteristic resulting from applying an alternating (sinusoidal) voltage across the cadmium selenide element 10 is shown (idealized) in FIGS. 3*a* and 3*b*. (Similar hysteretic characteristics are exhibited when alternating voltages having other wave forms are used.)

In the graph shown in FIG. 3*a*, the ordinate is current (I) through the cadmium selenide element, and the abscissa is instantaneous voltage (V) applied across the element 10. In the graph shown in FIG. 3*b*, the abscissa is instantaneous voltage (V) applied across the cadmium selenide element 10, and the ordinate is increasing time (T) in the downward direction. The alternating applied voltage 21 shown in FIG. 3*b* has an amplitude less than the threshold voltage A of the element but greater than the cut-off voltage B.

Provided the voltage across the cadmium selenide element has not previously exceeded the threshold voltage A of the element, the element 10, with the applied voltage 21 thereacross, is in its quiescent state, and the voltage-current characteristic of the element is shown by line R21 in FIG. 3*a*.

If the voltage across the element 10 is increased, as by the superposition of a triggering voltage to the applied voltage 21, to exceed the threshold voltage A of the element for a period longer than the excitation time of the cadmium selenide material, the element is driven into its excited state of high conductivity and has a voltage-current characteristic as shown by line R22 in FIG. 3*a*. Further, and provided the interval of time during which the instantaneous amplitude of the applied voltage 21 is equal to or less than the cut-off voltage B (such time interval being indicated at TI in FIG. 3*b*) is less than the relaxation time of the cadmium selenide material, the element 10 remains in its excited state of higher conductivity after the termination or removal of the triggering voltage. That is, although the instantaneous amplitude of the applied voltage 21 periodically decreases below the cut-off voltage B (but for a time less than the relaxation time of the cadmium selenide material) element 10 remains in its excited state.

To return the cadmium selenide element from its excited state to its quiescent state, the amplitude of the applied voltage is reduced below the cut-off voltage B for a period longer than the relaxation time of the cadmium selenide material.

With presently available cadmium selenide material, the "excitation" time is in the microsecond region and triggering voltage pulses may be used. To some extent, the threshold voltage is a function of the pulse width. That is, a voltage pulse of long duration may trigger the cadmium selenide material at a lower voltage amplitude than a pulse of shorter duration. The "relaxation" time of presently available cadmium selenide material is in the millisecond region.

When properly biased, the conductivity hysteretic effect described provides the cadmium selenide element 10 with two stable levels of conductivity, hence with the characteristics of an electrical switch. That is, by biasing the cadmium selenide element with a voltage having an amplitude between the threshold and cut-off voltages of the element, the resistance of the element may be switched back and forth by the application of triggering and relaxing voltages.

A block diagram of a display device is shown in FIG. 4 comprising a 2×2 matrix of four units. Each unit comprises a cadmium selenide element 10 in series with an electroluminescent cell 30. Each unit is located at a junction of a row and column conductor. That is, each EL cell is connected to a column conductor 32 or 34, and each cadmium selenide element is connected to a row conductor 36 or 38. The matrix may be built-up to any desired size by the addition of further cadmium selenide-EL units connected in rows and columns.

For electrically operating the matrix, an alternating voltage bias source 40 is connected across each of the row and column conductors 32, 34, 36, 38, as shown. The amplitude of the bias voltage and the ratio of the impedances of the EL cell 30 and the cadmium selenide element 10 of each matrix unit are such that the portion of the bias voltage across the cadmium selenide element 10 of each unit, whether the cadmium selenide element is in its quiescent or excited state, is less than the threshold voltage and greater than the cut-off voltage of the cadmium selenide element. When the cadmium selenide element of a matrix unit is in its quiescent state (low conductivity) the portion of the bias voltage across the EL element of that unit is too small to cause any visible luminous emittance from the EL cell. When the cadmium selenide element is in its excited state (high conductivity) the portion of the bias voltage across the EL cell is sufficiently high to cause the EL cell to emit visible light. A numerical example is given hereinafter for more fully explaining the operation of each matrix unit.

For driving the cadmium selenide element of each matrix unit into its excited state, the voltage applied across the cadmium selenide element of the unit is increased above the threshold voltage of the cadmium selenide element for a period longer than the excitation time of the cadmium selenide material. This is preferably done by superimposing a triggering voltage upon the bias voltage at each matrix unit. For providing individual addressing of each matrix unit independently of the other matrix units, coincident triggering voltages are used. In FIG. 4, triggering voltage sources $X_1$, $X_2$, $Y_1$, $Y_2$ are shown in each row and column conductor in series with the bias voltage source 40, each source being independently and selectively operable. Each voltage source $X_1$, $X_2$, $Y_1$, $Y_2$, provides a voltage having an amplitude of one half the voltage required to trigger the cadmium selenide element and in such phase relation as to add to the bias voltage across each matrix unit. If a row and column triggering half voltages are simultaneously applied across a matrix unit, the voltage across the cadmium selenide element exceeds the threshold voltage for a period longer than the excitation time and the cadmium selenide element is driven into its excited state. If only one triggering half voltage is applied to a matrix unit, it is not sufficient to induce transition of the cadmium selenide element into its excited state.

The arrangement described provides the matrix with an "AND" gate characteristic. That is, only the particular matrix unit addressed at the junction of both a row and column triggering half voltage is triggered into a state of luminous emission while none of the other units along the column and row address lines of the particular unit being addressed is triggered.

Upon removal of the triggering voltage, the bias voltage source 40 maintains the cadmium selenide element in its excited state of increased conductivity. The portion of the bias voltage appearing across the cadmium selenide element is thus lowered and the portion of the bias voltage appearing across the EL cell is increased to a value sufficient to cause the EL cell to emit visible light.

To return the cadmium selenide element from the excited state to the quiescent state for the purpose of darkening or "erasing" the EL cell controlled thereby, the voltage applied across the cadmium selenide element is reduced below the cut-off voltage of the cadmium selenide element for a time longer than the relaxation time of the cadmium selenide material. This is accomplished by providing erase voltages in series with the bias voltage in the same manner as the triggering voltages are applied. That is, to provide individual erasing of each matrix unit independently of the other matrix units, the erase voltage necessary to reduce the bias voltage to an amplitude below the cut-off voltage is divided into two erase half voltages each having an amplitude of one half the required erase voltage. In FIG. 4, the voltage sources $X_1$, $X_2$ and $Y_1$, $Y_2$ are selectively and independently operated to provide erase half voltages for the proper duration and proper amplitude which subtract from or "buck" the bias voltage. A return of the cadmium selenide element to its quiescent state lowers its conductivity and increases the portion of the bias voltage appearing across it. The remaining bias voltage appearing across the EL cell is insufficient to cause visible light emission from the cell.

Means for electrically addressing a matrix are known in the art, see for example, U.S. Patents 3,037,189 to Barrett et al. for a Visual Display System, and 2,904,626 to Rajchman et al. for an Electrical Display Device. Addressing means are thus not shown herein.

In one embodiment of the matrix shown in FIG. 4, the EL cell used has an impedance of about $11\times10^6$ ohms and is preferably operated in its luminous mode at a voltage of 125 volts RMS at a frequency of 420 c.p.s. The cadmium selenide element 10 is designed, as follows (all values being approximate), to provide a proper electrical match with the EL cell.

The alternating current voltage equation for each matrix unit is:

$$V_B^2=V_{EL}^2+V_C^2$$

where:

$V_B$ is the bias voltage applied across the matrix unit,
$V_{EL}$ is the voltage across the EL cell, and
$V_C$ is the voltage across the cadmium selenide control element.

The applied bias voltage in the embodiment is 250 volts RMS at a frequency of 420 c.p.s., and to operate the EL cell in its luminous mode with 125 volts thereacross, the voltage across the cadmium selenide element is:

$$V_C^2=(250)^2-(125)^2$$

$$V_C=216 \text{ volts}$$

The current is determined by the voltage drop across the EL cell, that is $$I=V_{EL}/Z_{EL}$$

where:

$Z_{EL}$ is the impedance of the EL cell. Hence:

$$I=\frac{125}{11\times10^6}$$

$$I=11.7\times10^{-6} \text{ amp.}$$

The impedance of the cadmium selenide element in its excited state (that is, while the EL cell is luminous) should be:

$$Z_C=\frac{V_C}{I}$$

$$=\frac{216}{11.7\times10^{-6}}$$

$$=18.5\times10^6 \text{ ohms}$$

That is, the cadmium selenide element 10 should have an impedance of $18.5\times10^6$ ohms in order that the voltage across the EL cell in its luminous mode of operation is 125 volts RMS.

The impedance of the cadmium selenide element is given by:

$$z=pl/tw$$

where:

$p$ is the resistivity
$l$ is the gap length or distance between the spaced ends of the metal electrodes,
$w$ is the gap width, and
$t$ is the thickness of the cadmium selenide layer.

For experimental purposes and calculation, the thickness is combined with the resistivity and designated by an experimentally measured quantity, $p'=p/t$. The impedance of the cadmium selenide element is thus given by:

$$Z_C=p'l/w$$

For the cadmium selenide material used, the values of $p'$ were measured to be 800 megohms in the quiescent state ($p_q'$), and 13 megohms in the excited state ($p_e'$). Thus:

$$\frac{Z_C}{p_e'}=\frac{l}{w}$$

and $$\frac{l}{w}=\frac{18.5\times10^6}{13\times10^6}$$

$$\frac{l}{w}=1.42$$

In the embodiment shown in FIG. 4, the triggering voltage used to drive the cadmium selenide element 10 into its excited state is 285 volts RMS. The electric field needed to trigger the cadmium selenide crystallites into their excited state is 57 RMS volts per mil, and the cut-off field is 30 RMS volts per mil. The electric field through the cadmium selenide element is given approximately as follows:

$$V_t=\frac{E_t}{.001}\times l$$

where:

$V_t$ is the trigger voltage, and
$E_t$ is the electric field.

The distance between the ends of the metal electrodes is thus:

$$l=\frac{V_t}{E_t}\times.001$$

$$l=\frac{285}{57}\times.001$$

$$l=0.005 \text{ inch}$$

The gap width is:

$$\frac{l}{w}=1.42$$

$$w=\frac{0.005}{1.42}$$

$$=0.0035 \text{ inch}$$

The cut-off voltage for the cadmium selenide element with the above gap dimensions is given by:

$$V_{CO}=\frac{E_{CO}}{.001}\times l$$
$$=\frac{30}{0.001}\times 0.005$$
$$=150 \text{ volts}$$

The cut-off voltage of the cadmium selenide element is thus less than the bias voltage of 216 volts which appears across the cadmium selenide element while the EL cell is luminous. Hence, once triggered into its excited state, the cadmium selenide element 10 remains in such state until the voltage across the cadmium selenide element is reduced below the cut-off voltage of 150 volts.

The above design provides the proper conditions for the illuminated mode of operation of the matrix unit. The design also provides the proper conditions for the darkened mode of operation, as now described.

The impedance of the cadmium selenide element in its quiescent state is:

$$Z=\frac{p'_{d}l}{w}$$
$$=\frac{800\times 10^6\times 0.005}{.0035}$$
$$=1140\times 10^6 \text{ ohms}$$

The current in each matrix with the matrix unit non-illuminated and with the cadmium selenide element 10 in its quiescent state is given by:

$$I=\frac{V}{Z_{EL}+Z_C}$$
$$=\frac{250}{11\times 10^6+1140\times 10^6}$$
$$=0.217\times 10^{-6} \text{ amp.}$$

The voltage drop across the EL cell in the non-illuminated case is:

$$V=IZ_{EL}$$
$$=0.217\times 10^{-6}\times 11\times 10^6$$
$$=2.38 \text{ volts}$$

This voltage drop is not sufficient to produce any luminous emittance from the EL cell, hence, the EL cell is completely dark. Thus, since each matrix unit is operable either in an illuminated or completely darkened mode, each unit of the matrix described has, with zero ambient light, an infinite contrast ratio.

FIG. 5 shows a cadmium selenide element 10' usable for providing a display device having tonal values or grey scale capability, that is, a display device wherein the luminescence of each matrix unit may be varied. The cadmium selenide element 10' comprises a glass substrate 12', spaced metal electrodes 14', and a layer 16' of cadmium selenide material extending over and between the ends of the metal electrodes. The ends of the metal electrodes 14' are pointed or angled, and the distance between the electrode ends varies from side to side of the electrodes. Thus, with a voltage applied across the electrodes, the electric field through the cadmium selenide material is non-uniform and, depending upon the amplitude of a triggering or erase voltage applied across the electrodes, more or less cadmium selenide crystallites are switched from one conductivity state to another. That is, for a given bias voltage and a small trigger voltage one may switch only those crystallites in the region of highest electrical field, which is the region of closest gap spacing. When a larger trigger voltage is applied the crystallites located in a region having a wider gap spacing may then also be switched. Since the impedance of each element is an average of the impedance of all the crystallites therein, the element impedance can be modulated by controlling the fraction of crystallites within each element that are switched to a low impedance state. The impedance of the cadmium selenide element 10', hence the voltage drop thereacross, are thus dependent upon the amplitude of the voltages used to trigger and relax the element. Connected in a matrix of the type shown in FIG. 4, the portion of the bias voltage source 40 appearing across the EL element, hence the luminous emittance thereof, is controllable by the use of triggering and erase voltages of different amplitudes.

FIGS. 6 and 7 illustrate an integrated solid-state display device. On one surface of a glass plate 50 a plurality of transparent parallel conductive strips 52 of stannous oxide or tin chloride, or the like, are coated. Strips 52 serve as the column conductors 32, 34 of the matrix shown in FIG. 4. Covering the conductive strips 52 and the glass plate 50 is a uniform layer 54 of an electroluminescent material, such as activated zinc sulphide suspended in a plastic dielectric such as araldite or krylon. Covering the electroluminescent layer 54 is a thin layer 56 of an opaque, high dielectric material such as barium titanate. A mosaic of square opaque electrodes 58 of a metal, such as aluminum, is provided, as by evaporation, on the barium titanate layer 56. Each of the electrodes 58 overlies a portion of the conductive strips 52, as shown in FIG. 6. The dielectric material layer 56 serves as a filler for interparticle voids present in the electroluminescent material and provides a smooth surface on which the aluminum squares are more satisfactorily evaporated. Also, layer 56 prevents arcing across the electroluminescent layer 54.

Each electrode square 58, the electroluminescent material thereunder, and the portion of the conductive strip 52 overlaid by the electrode square 58 form an electroluminescent cell.

Uniformly covering the electrode squares 58 and the portions of barium titanate layer 56 not covered by the metal squares 58 is a layer 60 of cadmium selenide material in an ethyl cellulose carrier. Since the electrical characteristics of cadmium selenide are affected by light, the opaque dielectric material layer 56 also serves the purpose of preventing light from the electroluminescent cells from reaching the cadmium selenide. This prevents changes in the electrical characteristics of the cadmium selenide, whereby greater uniformity of characteristics of the various matrix units is obtained.

Imbedded in the cadmium selenide layer adjacent the top surface thereof are a plurality of wires 64 which extend perpendicular to the conductive strips 52 and which overlie in-line electrode squares 58. Wires 64 serve as the conductors 36, 38 of the matrix shown in FIG. 4. The control elements of the matrix comprise a portion or length of wire 64, the electrode square 58 beneath the wire portion, and the cadmium selenide material therebetween. The series connection between each cadmium selenide control element and the corresponding electroluminescent cell is provided by an electrode square 58 which serves as an electrode for both the cadmium selenide control element and the electroluminescent cell. Electrode squares 58 provide segmentation of the cadmium selenide and electroluminescent layers into individual cells.

For providing the display device shown in FIGS. 6 and 7 with tonal or grey scale capabilities, supplemental wires 66 are provided, as shown in FIG. 8. Wires 66 extend parallel to wires 64 but closer to the electrode squares 58, as shown. Each wire 66 is electrically connected to its immediately adjacent wire 64 so that pairs of wires 64 and 66 provide the row conductors for the matrix. Because of the difference in spacing between the electrode squares 58 and each of wires 64 and 66, the electric field in the cadmium selenide material between the wires 64 and the electrode squares is smaller than the electric field between the wires 66 and the electrode squares for a given voltage applied to the wires. Thus, as described in connection with the control element 10' shown in FIG. 5, the conductivity of the cadmium selenide control elements is dependent upon the amplitude of the triggering and erase voltages applied thereto, and the level of luminous emittance of the electroluminescent cells is thus also dependent upon the amplitude of the triggering and erase voltages.

In one embodiment of the display device illustrated in FIGS. 6 and 7, the conductive strips 52 are 40 mils wide with a center to center spacing of 50 mils. This gives a resolution of 20 lines to the inch. The electrode squares 58 are 40 mils square with a 50 mil center to center spacing and have a thickness of a few thousand angstroms. The electroluminescent layer 54 is about 1.25 mils thick. The barium titanate layer 56 is about 0.3 to 0.4 mil thick and the cadmium selenide material is about 10 mils thick. Wires 64 have a diameter of 2.5 mils and are spaced about 6 mils above the electrode squares 58. Wires 66, if used, have a diameter of 2.5 mils and are spaced about 4 mils above the electrode squares.

While the present invention has been described in connection with cadmium selenide material, other semi-conductor materials, such as cadmium sulphide and zinc oxide, exhibit similar hysteretic characteristics and also may be used. With present available materials, however, the time required for the hysteretic action of the cadmium sulphide and zinc oxide is considerably longer than the time required for cadmium selenide. With cadmium selenide, the triggering time is in the microsecond range while the triggering time for cadmium sulphide, for example, is in the millisecond range. For providing a display device having a fast updating time, cadmium selenide material is thus preferred.

What is claimed is:

1. In a display device, a unit comprising an elemental light emitting area and a control element in series, the light output of said light emitting area being dependent upon the amplitude of voltage applied thereacross, said control element having an electrical conductivity hysteretic characteristic providing said element, when a range of A.C. bias voltages are applied thereto, with different levels of impedance responsive to voltage deviations from said bias range, and having a relaxation time characteristic before which it can switch from a high conductivity state to a low conductivity state, means for applying an A.C. voltage across said unit, the amplitude of said applied voltage and the relative impedances of said light emitting area and said control element, at any level of impedance of said control element, being such that a voltage within said bias range is applied across said control element, said applied A.C. voltage being such that it remains, for a time less than the relaxation time of the control element, at a value which would cause said control element to switch from a high conductivity state to a low conductivity state, and means for causing the voltage across said control element to deviate from said bias range for changing its impedance level.

2. In a display device, a unit comprising an electroluminescent cell and a control element in series, said control element having an electrical conductivity hysteretic characteristic providing said element, when a range of alternating bias voltages are applied thereto, with different levels of impedance responsive to voltage deviations from said bias range, and having a relaxation time characteristic before which it can switch from a high conductivity state to a low conductivity state, means for applying an alternating voltage across said unit, the amplitude of said applied voltage and the relative impedances of said electroluminescent cell and said control element, at any level of impedance of said control element, being such that a voltage within said bias range is applied across said control element, said applied alternating voltage being such that it remains, for a time less than the relaxation time of the control element, at a value at or below which said control element switches from a high conductivity state to a low conductivity state, and means for causing the voltage across said element to deviate from said bias range for changing its impedance level.

3. In a display device, a unit comprising an electroluminescent cell and a cadmium selenide control element in series, said control element having an electrical conductivity hysteretic characteristic providing said element, when a range of alternating bias voltages are applied thereto, with different levels of impedance responsive to voltage deviations from said bias range, and having a relaxation time characteristic before which it can switch from a high conductivity state to a low conductivity state, means for applying an alternating voltage across said unit, the amplitude of said applied voltage and the relative impedances of said electroluminescent cell and said control element, at any level of impedance of said control element, being such that a voltage within said bias range is applied across said control element, said applied alternating voltage being such that it remains, for a time less than the relaxation time of the control element, at a value at or below which said control element switches from a high conductivity state to a low conductivity state, and means for causing the voltage across said element to deviate from said bias range for changing its impedance level.

4. In a display device, a unit comprising an electroluminescent cell for emitting light when subjected to an alternating voltage, the light output of said cell being dependent upon the amplitude of said alternating voltage, a cadmium selenide control element in series with said cell, said control element having an electrical conductivity hysteretic characteristic providing the control element with two stable conductivity levels responsive to the amplitude of voltages applied thereto, and having a relaxation time characteristic before which it can switch from a high conductivity level to a low conductivity level, means for applying an alternating bias voltage across said unit, the portion of said bias voltage appearing across said control element being sufficient to maintain said control element at either conductivity level throughout each cycle of said alternating bias voltage, means for increasing the voltage across said control element for increasing the conductivity of said control element and thereby increasing the portion of the bias voltage appearing across said cell to an amplitude sufficient to cause visible light emission from said cell, and means for decreasing the voltage across said control element for decreasing the conductivity of said control element and thereby decreasing the portion of said bias voltage across said cell to an amplitude insufficient to cause visible light emission from said cell.

5. In a display device, a unit comprising a light-emitter for emitting visible light when subjected to a voltage, the light output of said emitter being dependent on the amplitude of said voltage, a control element in series with said emitter having an electrical conductivity hysteretic characteristic such that its conductivity is increased from a low value to a high value when it is subjected to a triggering voltage and decreases from said high value to said low value when it is subjected to an erase voltage, and having a relaxation time characteristic before which it can switch from a high conductivity state to a low conductivity state, means for applying an A.C. voltage across said unit to provide a bias voltage across the control element having an amplitude between said triggering and said erase voltages for maintaining said control element at either of said values of conductivity after the application of one of said triggering and erase voltages, said applied A.C. voltage being such that it remains, for a time less than the relaxation time of the control element, at a value at or below which said control element switches from a high conductivity state to a low conductivity state, means for applying a triggering voltage to said control element for increasing its conductivity and increasing the portion of the applied voltage across said light-emitter to an amplitude sufficient to cause visible light emission therefrom, and means for applying an erase voltage to said control element for decreasing its conductivity and decreasing the portion of said applied voltage across said light-emitter to an amplitude insufficient to cause visible light emission therefrom.

6. In a display device, a unit having tonal capabilities comprising an electroluminescent cell for emitting visible light when subjected to an alternating voltage, the light output of said cell being dependent on the amplitude of said voltage, a control element in series with said cell having an electrical conductivity hysteretic characteristic such that its conductivity is increased from a low level to a high level when it is subjected to a triggering voltage in excess of a threshold voltage and decreases from said high level to a low level when it is subjected to an erase voltage of an amplitude less than a relaxation voltage for a time greater than a relaxation time, the values of said high and low levels of conductivity being dependent upon the amplitudes of said triggering and erase voltages, respectively, means for applying an alternating bias voltage across said unit to provide a bias voltage across the control element having an amplitude between said threshold voltage and said relaxation voltage for maintaining said control element at any of said high and low levels of conductivity after the application of one of said triggering and erase voltages thereto, said biased voltage during each cycle remaining, for a time shorter than said relaxation time, at an instantaneous value below said relaxation voltage means for applying a triggering voltage to said control element for increasing its conductivity to a high level for increasing the portion of the bias voltage across said cell, and means for applying an erase voltage to said control element for decreasing its conductivity to a low level for decreasing the portion of said bias voltage across said cell.

7. A display device comprising a matrix consisting of intersecting columns and rows, a light modulating unit connected serially between a column and a row at each of said intersections, each of said units comprising an electroluminescent cell for emitting visible light when subjected to an alternating voltage and a control element in series with said cell having an electrical conductivity hysteretic characteristic for providing said control element with different values of conductivity dependent upon the amplitude of an alternating voltage applied thereto, and having a relaxation time characteristic which must elapse before the element can switch from a high conductivity state to a low conductivity state, means for selectively applying triggering voltages and erasure voltages at each of said rows and columns for momentarily increasing and decreasing, respectively, the voltage across selected ones of said units for changing the conductivity of the control element of said selected unit for causing lighting or darkening, respectively, of said selected units, and means for providing an alternating bias voltage at the junction of each of said rows and columns for maintaining said control element at the value of conductivity determined by the application of one of said triggering and erase voltages, said bias voltage remaining, for a time less than the relaxation time of the control element, below the voltage at which said control element tends to switch from a high conductivity state to a low conductivity state.

8. A display device unit having tonal capabilities comprising an electroluminescent cell for emitting light when subjected to an alternating voltage, the light output of said cell being dependent upon the amplitude of said voltage, and a control element in series with said electroluminescent element, said control element comprising spaced apart electrodes and a semi-conductor crystallite material extending between said electrodes, the distance between said electrodes being non-uniform, whereby, for a given voltage across said electrodes, the electric field through said material is non-uniform, the crystallites of said material having an electrical conductivity hysteretic characteristic such that the conductivity of each crystallite is increased from a low value to a high value when it is subjected to a triggering electric field in excess of a threshold amplitude and decreases from said value to said low value when it is subjected to an erase electric field less than a cut-off amplitude, said cut-off amplitude being les than said threshold amplitude.

9. In a display device, a unit comprising a layer of electroluminescent material, a light transparent first electrical conductor on one side of said material, a second electrical conductor on the other side of said material, a semi-conductor material in contact with said second electrical conductor, and a third electrical conductor in contact with said semi-conductor material, said semi-conductor material being disposed between said second and third electrical conductors and having an electrical conductivity hysteretic characteristic providing said material, when a range of bias voltages are applied thereto, with different levels of impedance responsive to voltage deviations from said bias range, and having a relaxation time characteristic during which time said control element cannot switch from a low impedance level to a high impedance level, means for applying an A.C. bias voltage across said first and third electrical conductors, the amplitude of said applied A.C. bias voltage and the relative impedances of said electroluminescent material and said semi-conductor material, at any level of impedance of said semi-conductor material, being such that a voltage within said bias range is applied across said semi-conductor material, the instantaneous value of said A.C. bias voltage being, for a time less than the relaxation time, at or below that value necessary to cause switching from a low impedance level to a high impedance level, and means for causing the voltage across said control element to deviate from said bias range.

10. In a display device, a unit comprising a layer of electroluminescent material, a light transparent first electrical conductor on one side of said material, a second electrical conductor on the other side of said material, a semi-conductor material in contact with said second electrical conductor, means for optically shielding said semi-conductor material from said electroluminescent material, and a third electrical conductor in contact with said semi-conductor material, said semi-conductor material being disposed between said second and third electrical conductors and having an electrical conductivity hysteretic characteristic providing said material, when a range of bias voltages are applied thereto, with different levels of impedance responsive to voltage deviations from said bias range, and having a relaxation time characteristic during which time said control element cannot switch from a low impedance level to a high impedance level, means for applying an A.C. voltage across said first and third electrical conductors, the amplitude of said applied A.C. voltage and the relative impedances of said electroluminescent material and said semi-conductor material at any level of impedance of said semi-conductor material, being such that a voltage within said bias range is applied across said semiconductor material, the instantaneous value of said A.C. voltage being, for a time shorter than the relaxation time, at or below that value necessary to cause switching from a low impedance level to a high impedance level, and means for causing the voltage across said control element to deviate from said bias range.

11. In a display device, a unit comprising a layer of electroluminescent material, a light transparent first electrical conductor on one side of said material, a second electrical conductor on the other side of said material, cadmium selenide semi-conductor material in contact with said second electrical conductor, means for optically shielding said semi-conductor material from said electroluminescent material, and a third electrical conductor in contact with said semi-conductor material, said semi-conductor material being disposed between said second and third electrical conductors and having an electrical conductivity hysteretic characteristic providing said material, when a range of bias voltages are applied thereto, with different levels of impedance responsive to voltage deviations from said bias range, and having a relaxation time characteristic during which time said control element cannot switch from a low impedance level to a high impedance level, means for applying an A.C. bias voltage across said first and third electrical conductors, the amplitude of said applied A.C. bias voltage and the relative impedances of said electroluminescent material and said semi-conductor material at any level of impedance of said semi-conductor material, being such that a voltage within said bias range is applied across said semi-conductor material, the instantaneous value of said bias voltage being, for a time shorter than the relaxation time, at or below that value necessary to cause switching from a low impedance level to a high impedance level, and means for causing the voltage across said control element to deviate from said bias range.

12. In a display device, a unit comprising a layer of electroluminescent material, a light transparent first electrical conductor on one side of said material, a second electrical conductor on the other side of said material, a semi-conductor material in contact with said second electrical conductor, means for optically shielding said semi-conductor material from said electroluminescent material, and a third electrical conductor in contact with said semi-conductor material, said material being disposed between said second and third electrical conductors, the spacing between opposing surfaces on said second and third conductors being non-uniform, said semi-conductor material having an electrical conductivity hysteretic characteristic providing said material, when a range of voltages are applied thereto, with different levels of impedance responsive to the amplitude of voltage deviations from said bias range, means for applying a voltage across said first and third electrical conductors, the amplitude of said applied voltage and the relative impedances of said electroluminescent material and said semi-conductor material, at any level of impedance of said semi-conductor material, being such that a voltage within said bias range is applied across said semi-conductor material, and means for applying voltages of preselected amplitudes between said second and third electrical conductors for causing the voltage across said control element to deviate from said bias range.

13. A display device comprising a plurality of elemental light emitting areas arranged in X-coordinate rows and Y-coordinate columns, each light emitting area comprising an area of electroluminescent material, a light transparent first electrical conductor on one side of said material, a second electrical conductor on the other side of said material, a semi-conductor material in contact with said second electrical conductor, and a third electrical conductor in contact with said semi-conductor material, said semi-conductor material being disposed between said second and third electrical conductors and having an electrical conductivity hysteretic characteristic providing said material, when a range of bias voltages are applied thereto, with two levels of impedance responsive to voltage deviations above and below said bias range, and having a relaxation time characteristic during which time said control element cannot switch from a low impedance level to a high impedance level when the applied voltage falls below a relaxation voltage, a first plurality of coordinate conductors connecting the first electrical conductors of all the light emitting areas in each X-coordinate row to each other, a second plurality of coordinate conductors connecting the third electrical contacts of all the light emitting areas in each Y-coordinate column to each other, means for applying an A.C. bias voltage across the first and third electrical conductors of each light emitting area, the amplitude of said applied A.C. bias voltage and the relative impedances of said electroluminescent material and said semi-conductor material, at any level of impedance of said semi-conductor material, being such that a voltage within said bias range is applied across said semi-conductor material, the instantaneous value of said bias voltage remaining, for a time shorter than the relaxation time, at or below the relaxation voltage, and means for selectively increasing and decreasing the applied voltage across the light emitting area between any desired intersection of an X-coordinate and a Y-coordinate conductor for causing voltage deviations above and below said bias range, respectively, across said semi-conductor material.

14. A display device comprising a plurality of elemental light emitting areas arranged in X-coordinate rows and Y-coordinate columns, each light emitting area comprising an area of electroluminescent material, a light transparent first electrical conductor on one side of said material, a second electrical conductor on the other side of said material, cadmium selenide semi-conductor material in contact with said second electrical conductor, means for optically shielding said semi-conductor material from said electroluminescent material, and a third electrical conductor in contact with said semi-conductor material, said semi-conductor material being disposed between said second and third electrical conductors and having an electrical conductivity hysteretic characteristic providing said material, when a range of bias voltages are applied thereto, with two levels of impedance responsive to voltage deviations above and below said bias range, and having a relaxation time characteristic during which time said control element cannot switch from a low impedance state to a high impedance state, a first plurality of coordinate conductors connecting the first electrical conductors of all the light emitting areas in each X-coordinate row to each other, a second plurality of coordinate conductors connecting the third electrical contacts of all the light emitting areas in each Y-coordinate column to each other, means for applying an A.C. bias voltage across the first and third electrical conductors of each light emitting area, the amplitude of said applied A.C. bias voltage and the relative impedances of said electroluminescent material and said semi-conductor material, at any level of impedance of said semi-conductor material, being such that a voltage within said bias range is applied across said semi-conductor material, the instantaneous value of said bias voltage remaining, for a time shorter than the relaxation time, at or below that value necessary to cause switching from a low impedance level to a high impedance level, and means for selectively increasing and decreasing the applied voltage across the light emitting area between any desired intersection of an X-coordinate and a Y-coordinate conductor for causing voltage deviations above and below said bias range, respectively, across said semi-conductor material.

References Cited

UNITED STATES PATENTS 3,060,345 10/1962 Sack ---------------- 315—169
3,254,267 5/1966 Sack ---------------- 315—169
3,271,591 9/1966 Ovshinsky ---------- 307—88.5

DAVID J. GALVIN, *Primary Examiner.*